United States Patent
Yin et al.

(10) Patent No.: US 6,992,338 B1
(45) Date of Patent: Jan. 31, 2006

(54) CMOS TRANSISTOR SPACERS FORMED IN A BICMOS PROCESS

(75) Inventors: Kevin Q. Yin, Irvine, CA (US); Amol Kalburge, Irvine, CA (US); Klaus F. Schuegraf, San Jose, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 10/936,927

(22) Filed: Sep. 9, 2004

Related U.S. Application Data

(62) Division of application No. 10/262,714, filed on Oct. 2, 2002, now Pat. No. 6,830,967.

(51) Int. Cl.
*H01L 31/0328* (2006.01)
*H01L 21/331* (2006.01)

(52) U.S. Cl. ............... 257/197; 257/273; 257/552; 257/555; 438/313; 438/340

(58) Field of Classification Search .......... 257/197, 257/192, 273, 274, 552, 555; 438/340, 313

See application file for complete search history.

(56) References Cited

U.S. PATENT DOCUMENTS

| | | | | |
|---|---|---|---|---|
| 5,124,271 A | * | 6/1992 | Havemann | 438/703 |
| 6,001,701 A | * | 12/1999 | Carroll et al. | 438/364 |
| 6,746,928 B1 | * | 6/2004 | Schuegraf et al. | 438/314 |
| 6,838,349 B2 | * | 1/2005 | Yamauchi | 438/350 |

* cited by examiner

*Primary Examiner*—Hsien-Ming Lee
(74) *Attorney, Agent, or Firm*—Farjami & Farjami LLP

(57) ABSTRACT

According to an exemplary method in one embodiment, a transistor gate is fabricated on a substrate. Next, an etch stop layer may be deposited on the substrate. The etch stop layer may, for example, be TEOS silicon dioxide. Thereafter, a conformal layer is deposited over the substrate and the transistor gate. The conformal layer may, for example, be silicon nitride. An opening is then etched in the conformal layer. Next, a base layer is deposited on the conformal layer and in the opening. The base layer may, for example, be silicon-germanium. According to this exemplary embodiment, an emitter may be formed on the base layer in the opening. Next, the base layer is removed from the conformal layer. The conformal layer is then etched back to form a spacer adjacent to the transistor gate. In one embodiment, a structure is fabricated according to the above described exemplary method.

12 Claims, 9 Drawing Sheets

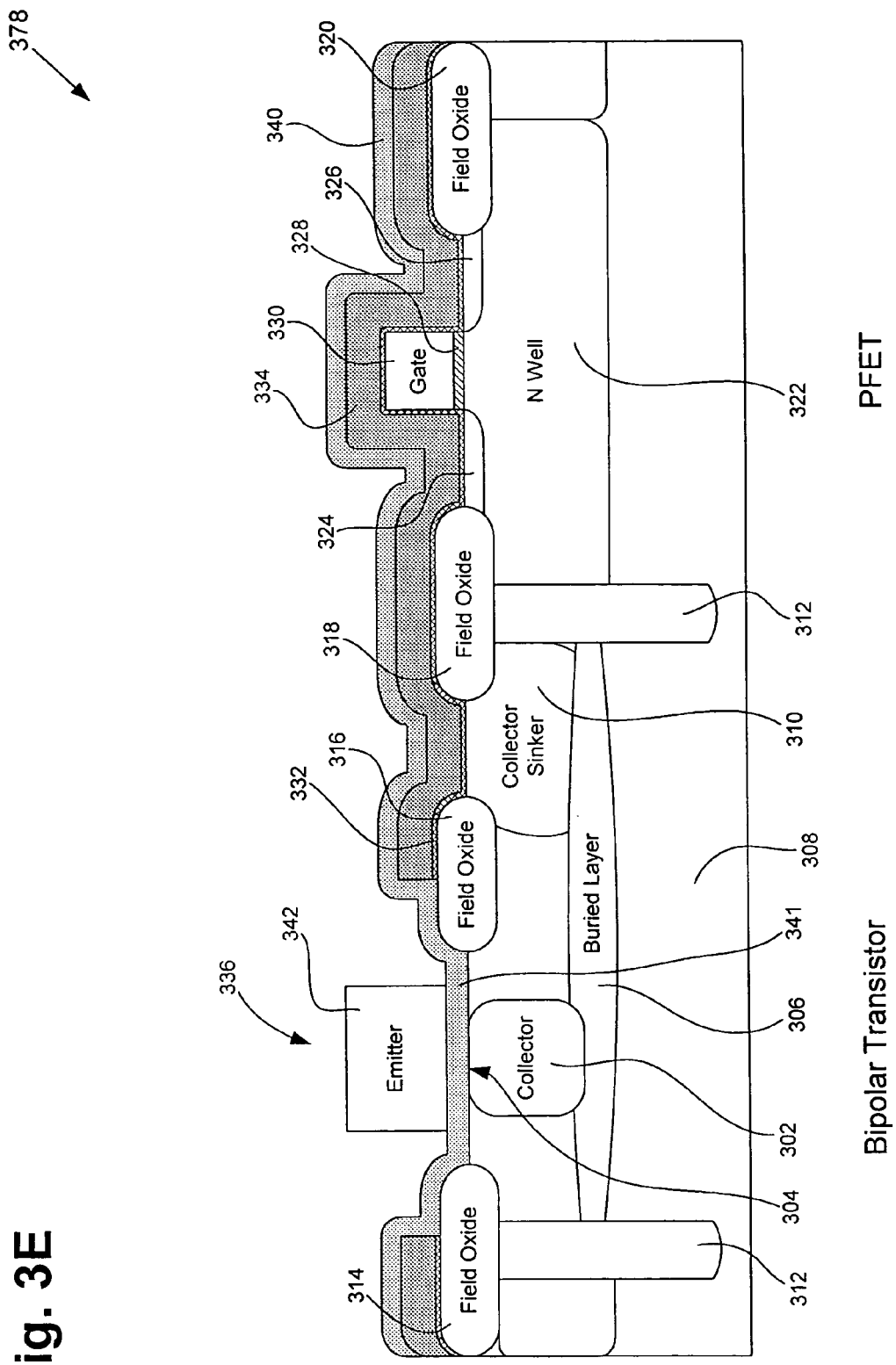

CMOS TRANSISTOR SPACERS FORMED IN A BICMOS PROCESS

This is a divisional of application Ser. No. 10/262,714 filed Oct. 2, 2002, now U.S. Pat. No. 6,830,967.

BACKGROUND OF THE INVENTION

1. Field of the Invention

The present invention relates to the field of fabrication of semiconductor devices. More specifically, the invention relates to the fabrication of bipolar and CMOS transistors.

2. Background Art

In one type of bipolar transistor, and more particularly a heterojunction bipolar transistor ("HBT"), used as an example in the present application, a thin silicon-germanium ("SiGe") layer is grown as the base of the bipolar transistor on a silicon wafer. The SiGe HBT has significant advantages in speed, frequency response, and gain when compared to a conventional silicon bipolar transistor. Speed and frequency response can be compared by the cutoff frequency which, simply stated, is the frequency where the gain of a transistor is considerably reduced. Cutoff frequencies in excess of 100 GHz have been achieved for the SiGe HBT, which are comparable to the more expensive GaAs. Previously, silicon-only devices have not been competitive for use where very high speed and frequency response are required.

In addition to the above stated speed and frequency response advantages of bipolar transistors, such as the SiGe HBTs, circuits used in modern electronic devices, such as cellular phones, laptop computers, and mobile communication networks, also require low power consumption and high noise immunity typically provided by CMOS transistors. In an attempt to combine the benefits of bipolar transistors, such as SiGe HBTs, with the bipolar transistors and CMOS transistors on the same die. For example, a circuit comprising a SiGe HBT and a CMOS transistor can be fabricated on the same substrate using Bipolar Complementary-Metal-Oxide-Semiconductor ("BiCMOS") technology.

However, fabricating bipolar transistors and CMOS transistors on the same substrate can undesirably increase overall process complexity and manufacturing cost. Thus, semiconductor manufacturers are challenged to simplify process flow and reduce the manufacturing cost required to fabricate bipolar transistors and CMOS transistors on the same substrate.

In one approach, a gate for a CMOS transistor, such as a PFET, is formed in a CMOS region of a substrate and a collector is formed in a bipolar region of the substrate. A layer of dielectric material, such as silicon oxide, is deposited over the gate and surface of the substrate and etched back to form spacers on either side of the gate. Next, a thin oxide layer is deposited over the gate and surface of the substrate to protect the gate and underlying areas of the substrate from subsequent etch processes. A layer of polysilicon is deposited over the thin oxide layer to protect the CMOS region during subsequent bipolar transistor processing.

In the above approach, an opening in the layer of polysilicon is formed over the collector in the bipolar region of the substrate by patterning and etching the layer of polysilicon. A wet dip is then used to remove the thin oxide layer in the opening. A layer of base material, such as polycrystalline SiGe, is then epitaxially deposited over the layer of polysilicon and in the opening to form a SiGe base. An emitter is formed on the SiGe base in the opening, and unwanted base material is removed to form contacts for the SiGe base. After formation of the SiGe HBT, the protective layer of polysilicon is removed from the surface of the substrate.

In the above approach, a layer of dielectric material is deposited and etched back to form spacers for the PFET gate, and a separate layer of polysilicon is deposited to protect the CMOS region during formation of the bipolar transistor. Thus, in the above approach, the layer of dielectric material is only utilized to form spacers for the PFET gate, while the layer of polysilicon only protects the CMOS region during bipolar transistor formation and thus must be removed after the bipolar transistor is formed. Thus, the deposition and removal of the layer of polysilicon increases overall process complexity by increasing process steps. The deposition and removal of the layer of polysilicon also increases processing time, which results in an increase in manufacturing cost.

Thus, there is a need in the art for a method for forming spacers in a CMOS region of a substrate in a BiCMOS process that reduces process flow complexity and manufacturing cost.

SUMMARY OF THE INVENTION

The present invention is directed to method for forming CMOS transistor spacers in a BiCMOS process and related structure. The present invention addresses and resolves the need in the art for a method for forming spacers in a CMOS region of a substrate in a BiCMOS process that reduces process flow complexity and manufacturing cost.

According to an exemplary method in one embodiment of the present invention, a transistor gate is fabricated on a substrate. The transistor gate may, for example, be a PFET gate. Next, an etch stop layer may be deposited on the substrate. The etch stop layer may, for example, be TEOS silicon dioxide. Thereafter, a conformal layer is deposited over the substrate and the transistor gate. The conformal layer may, for example, be silicon nitride. An opening is then etched in the conformal layer. Next, a base layer is deposited on the conformal layer and in the opening. The base layer may, for example, be silicon-germanium.

According to this exemplary embodiment, an emitter may be formed on the base layer in the opening. Next, the base layer is removed from the conformal layer. The conformal layer is then etched back to form a spacer adjacent to the transistor gate. In one embodiment, the present invention is a structure fabricated according to the above described exemplary method. Other features and advantages of the present invention will become more readily apparent to those of ordinary skill in the art after reviewing the following detailed description and accompanying drawings.

BRIEF DESCRIPTION OF THE DRAWINGS

FIG. 3E illustrates cross-sectional views, which include portions of a wafer processed according to an embodiment of the invention, corresponding to certain steps of FIG. 2.

DETAILED DESCRIPTION OF THE INVENTION

The present invention is directed to method for forming CMOS transistor spacers in a BiCMOS process and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 1:
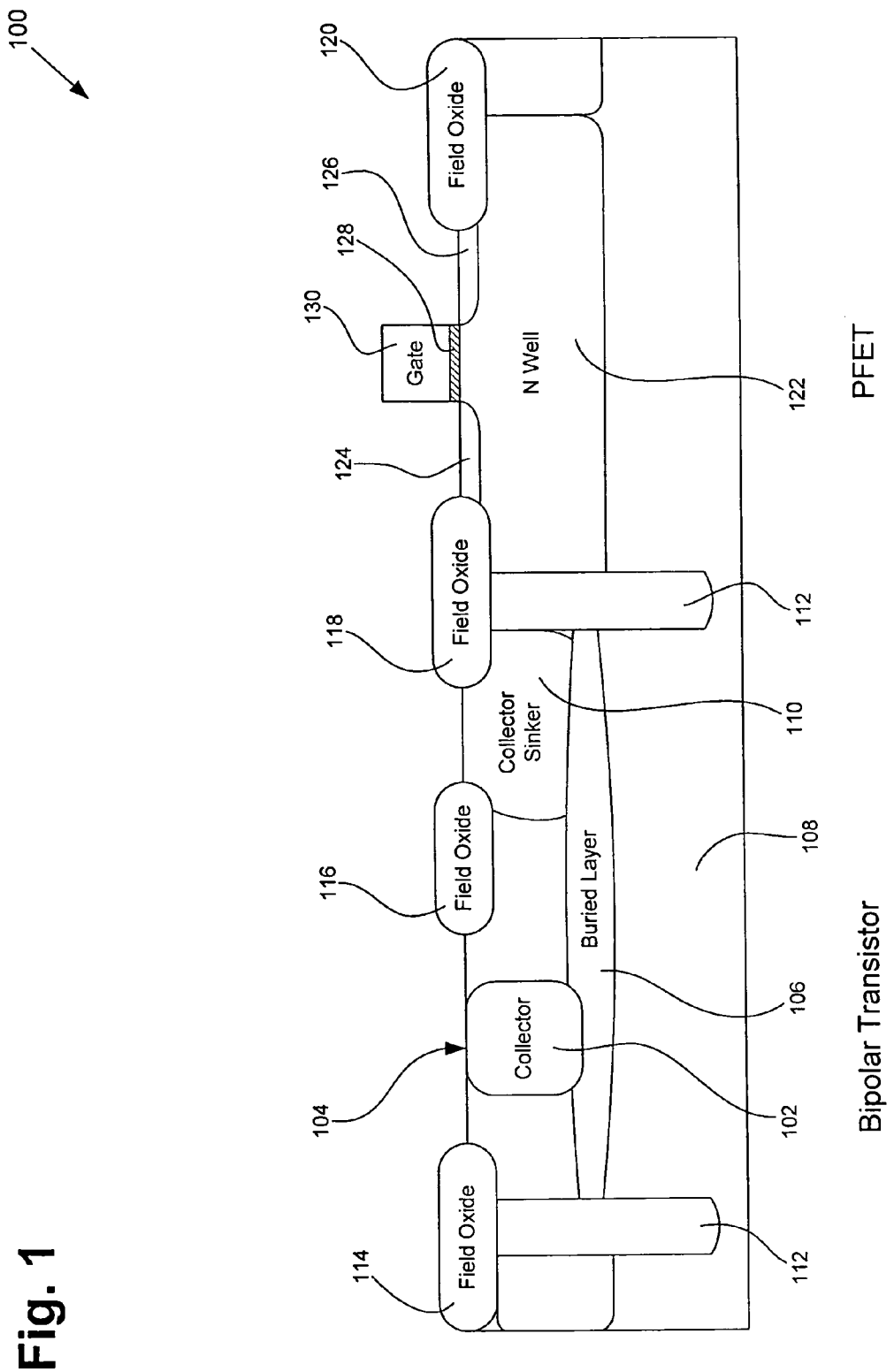
FIG. 1 illustrates a cross-sectional view of some of the features of an exemplary HBT and some of the features of an exemplary PFET prior to application of the steps taken to implement an embodiment of the present invention.

FIG. 1 shows exemplary structure 100, which is utilized to describe the present invention. Certain details and features have been left out of FIG. 1, which are apparent to a person of ordinary skill in the art. Structure 100 includes collector 102 for a bipolar transistor, such as a SiGe heterojunction bipolar transistor ("HBT"). Although an exemplary SiGe HBT is described in the present embodiment, other bipolar transistors may be used in the present invention, such as bipolar transistors comprising silicon, silicon-germanium-carbon, gallium-arsenide, or other materials.

In the present exemplary embodiment, collector 102 is N-type single crystal silicon that can be formed using a dopant diffusion process in a manner known in the art. Collector 102 has a top surface 104. In a subsequent step in the formation of a bipolar transistor described below, a base comprising, for example, P-type silicon-germanium single crystal, is epitaxially deposited on top surface 104 of collector 102. By the addition of base and emitter and formation of junctions and other structures in a manner known in the art, a SiGe NPN HBT is formed which includes collector 102.

As seen in FIG. 1, buried layer 106, which is composed of N+ type material, i.e. it is relatively heavily doped N-type material, is formed in silicon substrate 108 in a manner known in the art. Collector sinker 110, also comprised of N+ type material, is formed by diffusion of heavily concentrated dopants from the surface of collector sinker 110 down to buried layer 106. Buried layer 106, along with collector sinker 110, provide a low resistance electrical pathway from collector 102 through buried layer 106 and collector sinker 110 to a collector contact (the collector contact is not shown in any of the Figures). Deep trenches 112 and field oxide regions 114, 116, 118, and 120 may be composed of silicon dioxide ($SiO_2$) material and are formed in a manner known in the art. Deep trenches 112 and field oxide regions 114, 116, 118, and 120 provide electrical isolation from other devices on silicon substrate 108 in a manner known in the art.

Although field oxide regions 114, 116, 118, and 120 comprise silicon dioxide in the present embodiment, a person skilled in the art will recognize that other materials may be used, such as silicon nitride, a low-k dielectric, or other suitable dielectric material. Field oxide regions 114, 116, 118, and 120 can also be other forms of isolation, such as shallow trench isolation oxide ("STI"), formed in a manner known in the art.

Continuing with structure 100 in FIG. 1, structure 100 includes features and components of a CMOS structure, such as a PFET, on the same wafer as the NPN HBT. Although structure 100 illustrates an exemplary PFET, the present invention manifestly applies to other similar or related CMOS structures, such as NFETs. Structure 100 includes N well 122 for a PFET. N well 122 is N-type single crystal silicon that can be doped by ion implantation in a manner known in the art. Structure 100 further includes lightly doped areas 124 and 126 composed of P-type material, which also can be doped in a manner known in the art. Structure 100 also includes gate oxide 128 and gate 130, both formed in a manner known in the art. Gate 130 can comprise polycrystalline silicon. By the addition of N well 122, lightly doped areas 124 and 126, gate oxide 128, and gate 130, a PFET will be formed on the same wafer as a bipolar transistor, e.g. an NPN HBT.

Thus, FIG. 1 shows that structure 100 includes several components utilized to form a SiGe NPN HBT between field oxide region 114 and field oxide region 118, while structure 100 simultaneously includes several CMOS features and components such as a PFET that will be formed between field oxide region 118 and field oxide region 120. It is noted that the area between field oxide region 114 and field oxide region 118 on substrate 108 is also referred to as a "bipolar region" in the present application while the area between field oxide region 118 and field oxide region 120 on substrate 108 is also referred to as a "CMOS region" in the present application.

Figure 2:
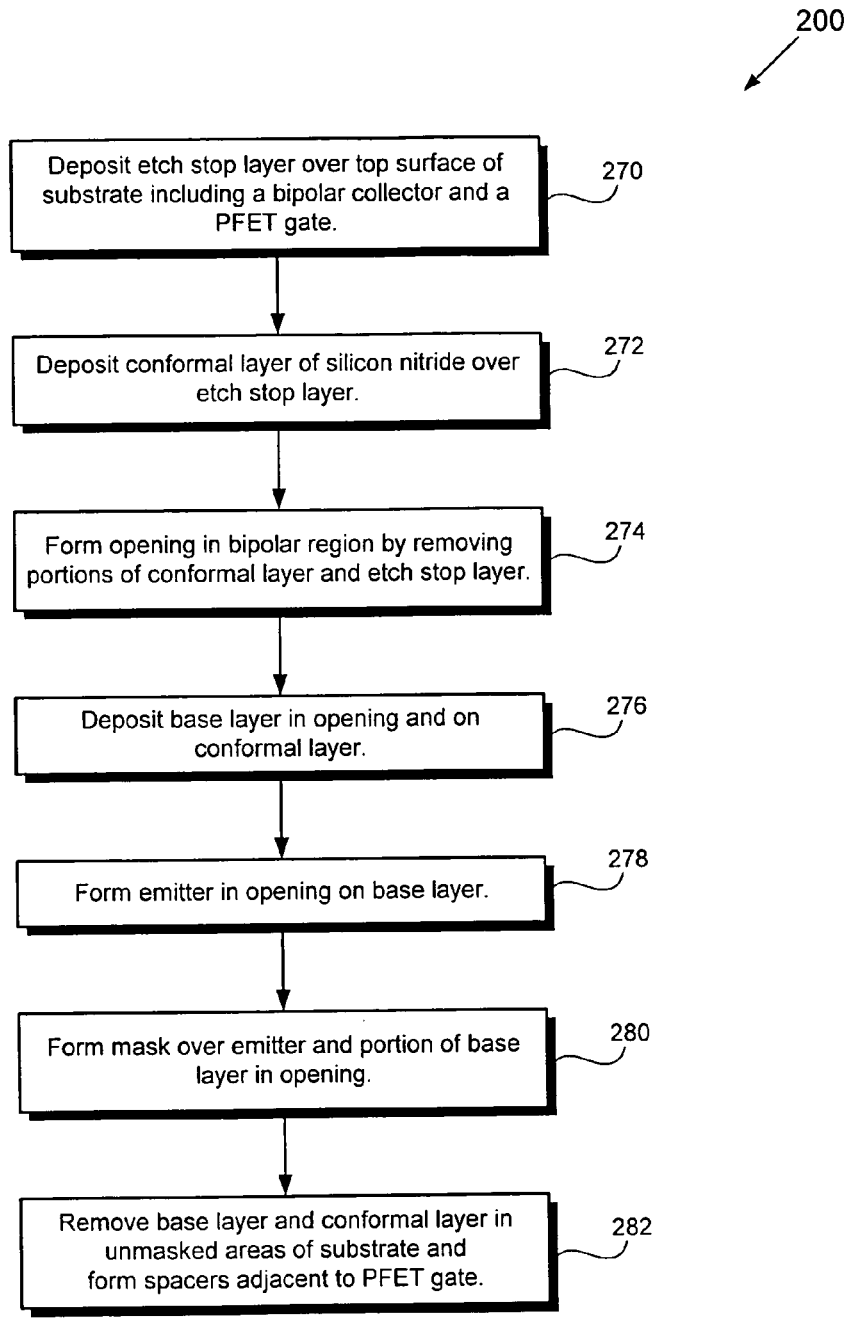
FIG. 2 shows a flowchart illustrating the steps taken to implement an embodiment of the present invention.

FIG. 2 shows flowchart 200, which describes the steps, according to one embodiment of the present invention, in the processing of a wafer that includes structure 100 of FIG. 1. Certain details and features have been left out of flowchart 200 that are apparent to a person of ordinary skill in the art. For example, a step may consist of one or more substeps or may involve specialized equipment or materials, as known in the art.

Steps 270 through 282 indicated in flowchart 200 are sufficient to describe one embodiment of the present invention, other embodiments of the invention may utilize steps different from those shown in flowchart 200. It is noted that the processing steps shown in flowchart 200 are performed on a wafer, which, prior to step 270, includes structure 100 shown in FIG. 1. In particular, the wafer includes a top surface of silicon substrate 108 on which formation of spacers for a PFET and formation of a base and emitter of a bipolar transistor are to take place in a BiCMOS process.

Moreover, structures 370, 372, 374, 376, 378, 380, and 382 in FIGS. 3A, 3B, 3C, 3D, 3E, 3F, and 3G illustrate the result of performing, on structure 100, steps 270, 272, 274, 276, 278, 280, and 282 of flowchart 200 of FIG. 2, respectively. For example, structure 370 shows structure 100 in FIG. 1 after processing step 270, structure 372 shows structure 370 after the processing of step 272, structure 374 shows structure 372 after the processing of step 274, and so forth.

Figure 3A:
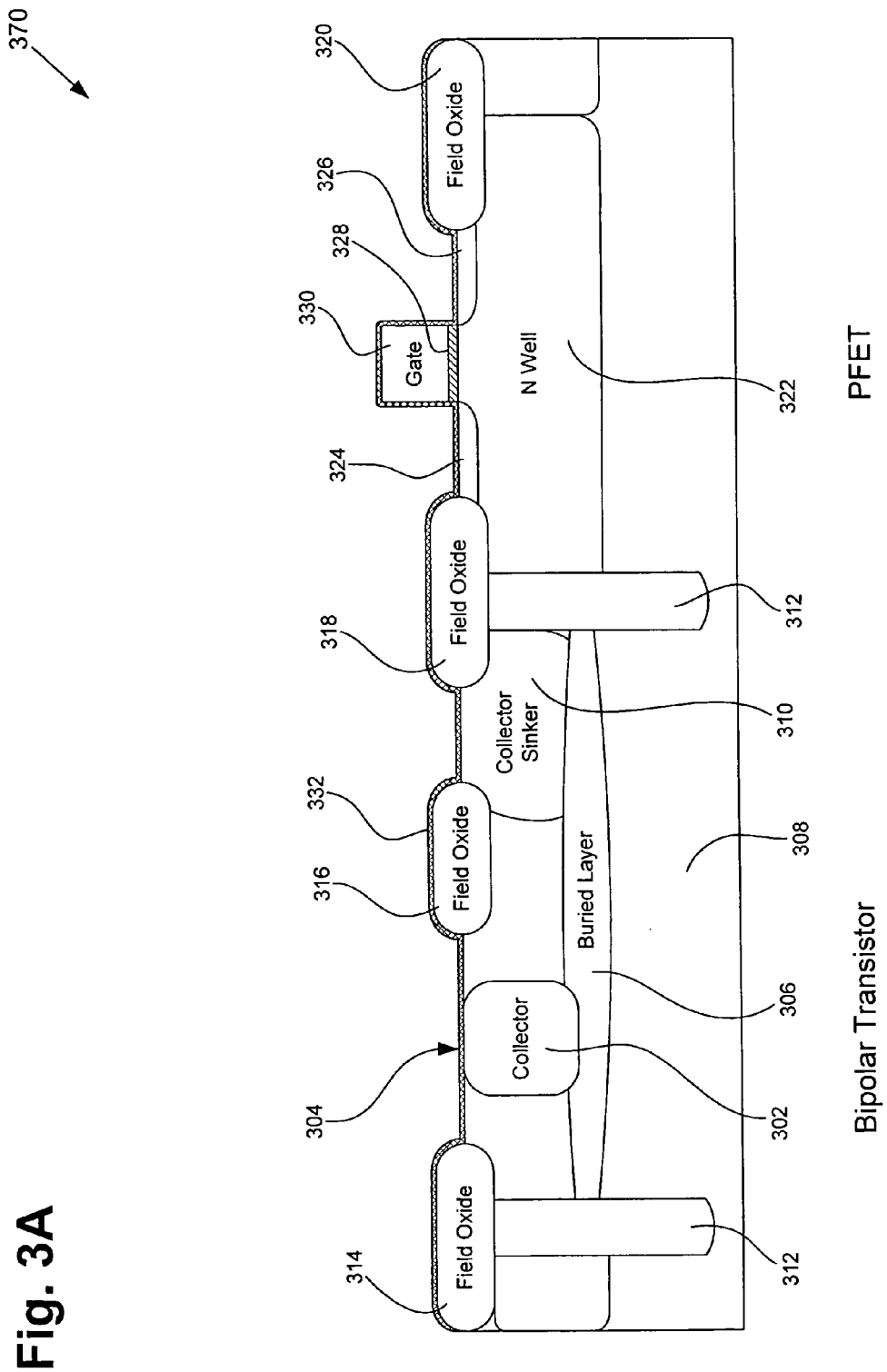
FIG. 3A illustrates cross-sectional views, which include portions of a wafer processed according to an embodiment of the invention, corresponding to certain steps of FIG. 2.

Referring now to FIG. 3A, structure 370 of FIG. 3A shows structure 100 of FIG. 1 after completion of step 270 of flowchart 200 in FIG. 2. In structure 370 in FIG. 3A, collector 302, top surface 304, buried layer 306, silicon substrate 308, collector sinker 310, deep trenches 312, field oxide regions 314, 316, 318, and 320, N well 322, lightly doped areas 324 and 326, gate oxide 328, and gate 330, respectively, correspond to collector 102, top surface 104, buried layer 106, silicon substrate 108, collector sinker 110, deep trenches 112, field oxide regions 114, 116, 118, and 120, N well 122, lightly doped areas 124 and 126, gate oxide 128, and gate 130 in structure 100 in FIG. 1.

Continuing with step 270 in FIG. 2 and structure 370 in FIG. 3A, step 270 of flowchart 200 comprises conformal deposition of etch stop layer 332 on a top surface of silicon substrate 308 including top surface 304 of collector 302 and gate 330. It is noted that silicon substrate 308 is also referred to as a "semiconductor die" in the present application. In the present embodiment, etch stop layer 332 can comprise a thin layer of silicon dioxide deposited from tetraethylorthosilicate ("TEOS"), also referred to as "TEOS silicon dioxide" in the present application. In one embodiment, etch stop layer 332 may comprise a thin layer of silicon oxide deposited in a low-pressure chemical vapor deposition ("LPCVD") process. The thickness of etch stop layer 332, for example, can be approximately 120.0 Angstroms. The result of step 270 of flowchart 200 is illustrated by structure 370 in FIG. 3A.

Figure 3B:
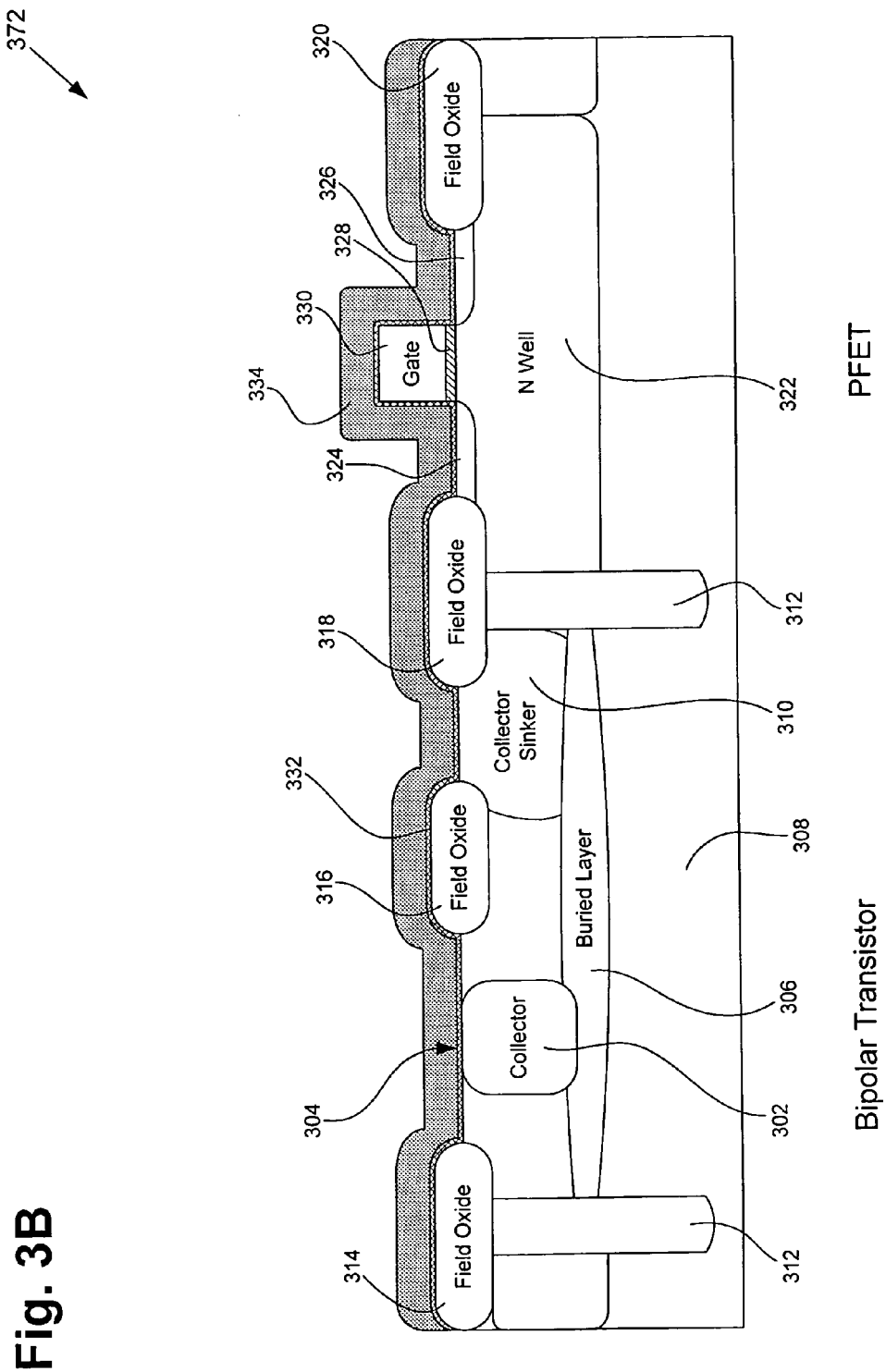
FIG. 3B illustrates cross-sectional views, which include portions of a wafer processed according to an embodiment of the invention, corresponding to certain steps of FIG. 2.

Referring to step 272 in FIG. 2 and structure 372 in FIG. 3B, at step 272 of flowchart 200, conformal layer 334 is deposited over etch stop layer 332. Conformal layer 334 can comprise silicon nitride deposited in a LPCVD process, i.e. LPCVD silicon nitride. In one embodiment, conformal layer 334 may comprise silicon nitride deposited in a reduced temperature chemical vapor deposition ("RTCVD") process. Conformal layer 334 can have a thickness, for example, of between approximately 800.0 Angstroms and approximately 1000.0 Angstroms. In one embodiment, conformal layer 334 can have a thickness of approximately 800.0 Angstroms. Conformal layer 334 protects the CMOS area, including gate 330, during fabrication of a bipolar transistor on substrate 308, and conformal layer 334 is also utilized to form spacers on both sides of gate 330 via an etch-back process in a subsequent step. Thus, in the present invention, conformal layer 334 is utilized for two purposes, i.e. for protecting the CMOS area during fabrication of a bipolar transistor and to form spacers on both sides of gate 330 in an etch back step. Referring to FIG. 3B, the result of step 272 of flowchart 200 is illustrated by structure 372.

Figure 3C:
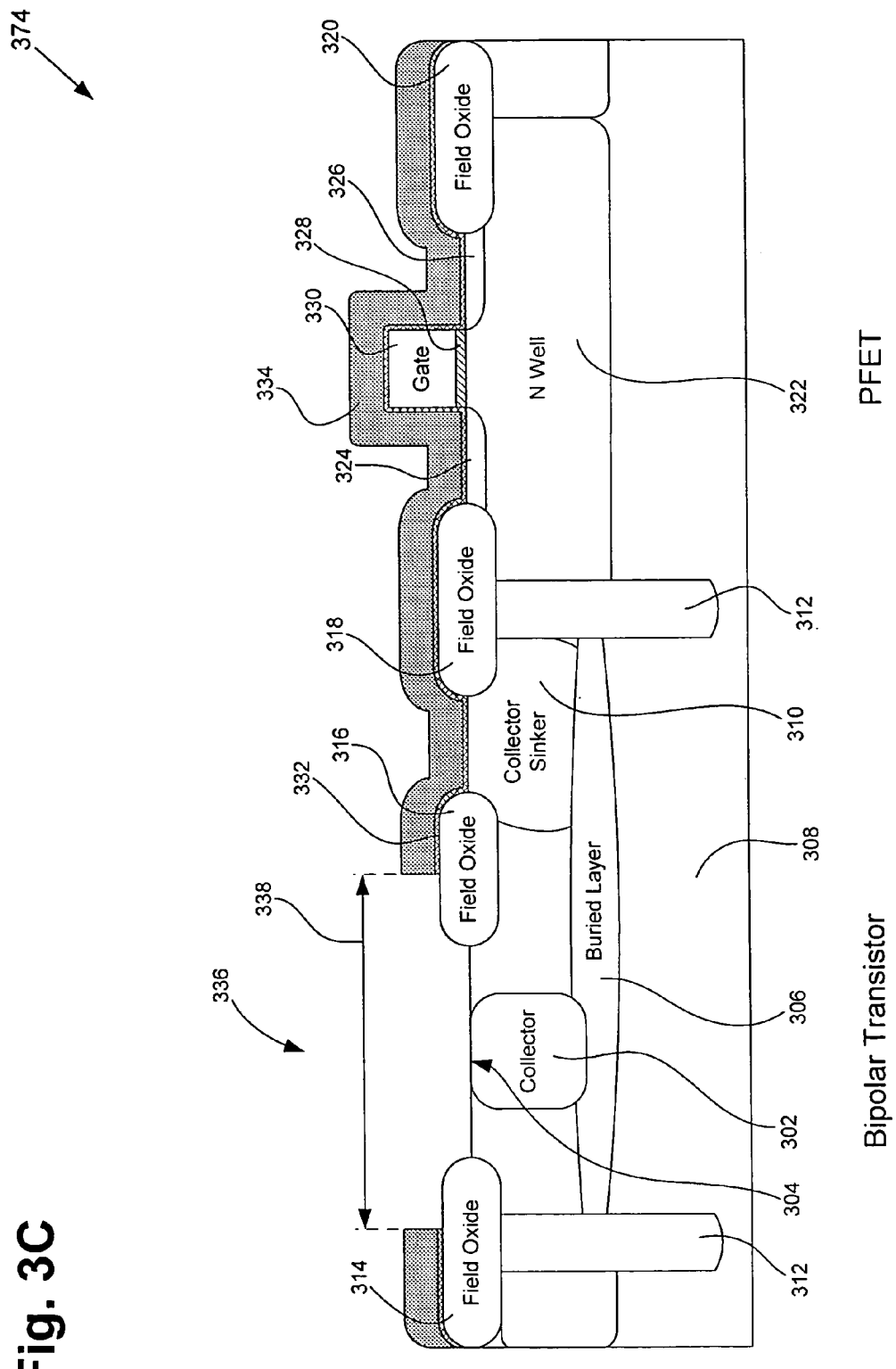
FIG. 3C illustrates cross-sectional views, which include portions of a wafer processed according to an embodiment of the invention, corresponding to certain steps of FIG. 2.

Continuing with step 274 in FIG. 2 and structure 374 in FIG. 3C, at step 274 of flowchart 200, opening 336 is formed by patterning and removing conformal layer 334 and etch stop layer 332 in the bipolar region of the substrate. Opening 336 can be patterned in a manner known in the art, such as by depositing a photoresist mask over conformal layer 334. In the present embodiment, conformal layer 334 can be removed by a selective etch utilizing a suitable enchant, for example, SF6/HBr. The SF6/HBr etchant is selective to silicon dioxide or silicon oxide, and thus the SF6/HBr etchant stops on etch stop layer 332. However, other etchants known in the art that are selective to silicon dioxide or silicon oxide may also be used to etch conformal layer 334.

Etch stop layer 332 can be removed by utilizing, for example, a HF wet etch. As state above, in the present embodiment, the thickness of etch stop layer 332 can be approximately 120.0 Angstroms. This relative thinness ensures minimal undercutting of etch stop layer 332 occurs during etching, and the dimensions of opening 336, most importantly width 338, can be controlled more precisely. Referring to FIG. 3C, the result of step 274 of flowchart 200 is illustrated by structure 374.

Figure 3D:
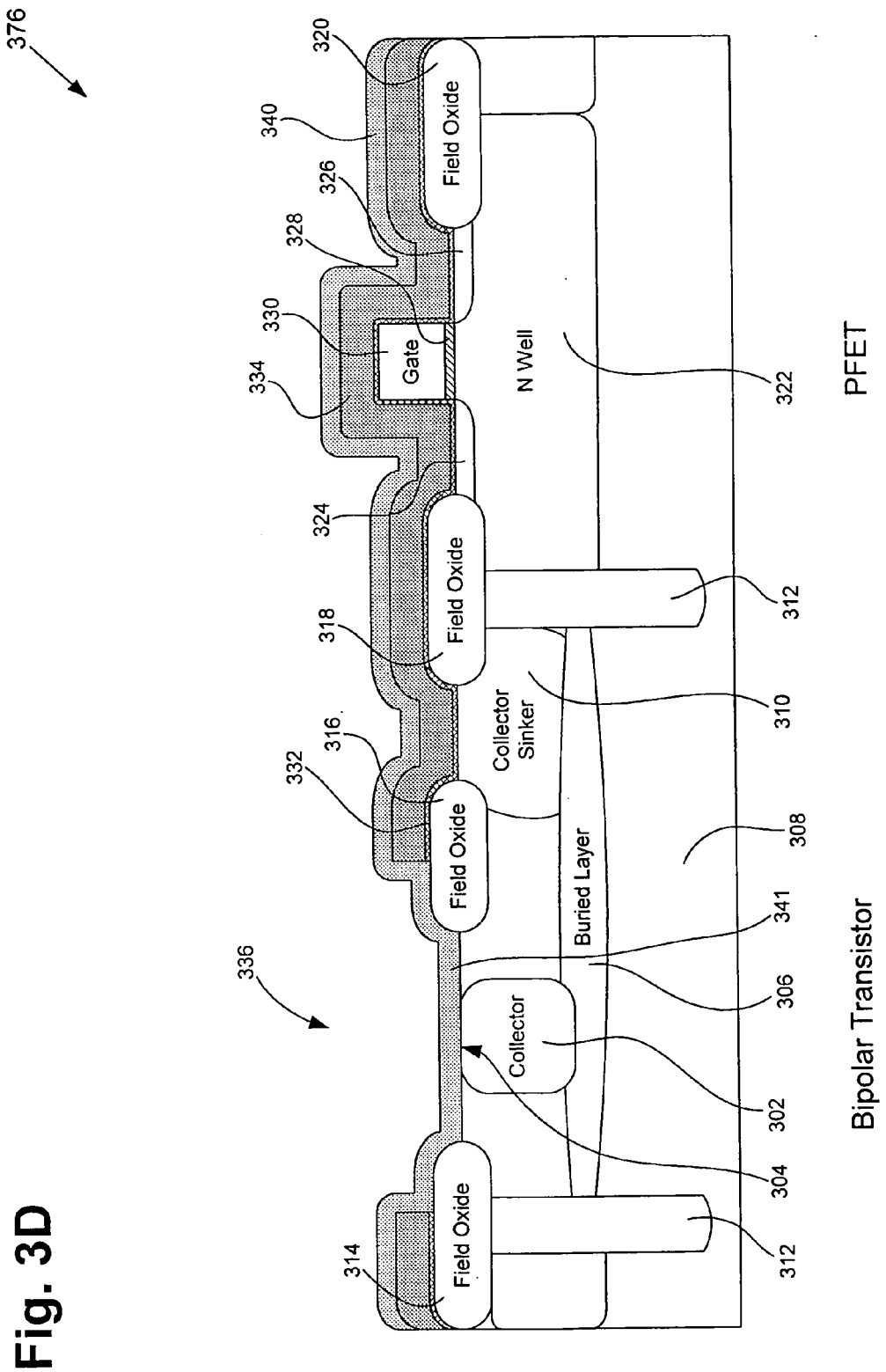
FIG. 3D illustrates cross-sectional views, which include portions of a wafer processed according to an embodiment of the invention, corresponding to certain steps of FIG. 2.

Continuing with step 276 in FIG. 2 and structure 376 in FIG. 3D, at step 276 of flowchart 200, base layer 340 is deposited in opening 336 and on conformal layer 334. Base layer 340 can comprise polycrystalline SiGe, which may be epitaxially deposited in a reduced pressure chemical vapor deposition ("RPCVD") process. In one embodiment, base layer 340 can comprise single crystal SiGe over top surface 304 of collector 302 and can comprise polycrystalline SiGe over conformal layer 334. A person skilled in the art will recognize that other materials besides SiGe could be grown or deposited in opening 336 and on conformal layer 334, depending on the purpose for such a deposit. Base 341 refers to the portion of base layer 340 situated between field oxide region 314 and field oxide region 316. Referring to FIG. 3D, the result of step 276 of flowchart 200 is illustrated by structure 376.

Continuing with step 278 in FIG. 2 and structure 378 in FIG. 3E, at step 278 of flowchart 200, emitter 342 is formed in opening 336 on base layer 340. Emitter 342 can be formed by depositing and patterning a polycrystalline material in opening 336 on base layer 340 in a manner known in the art. In one embodiment, emitter 342 can comprise N-type polycrystalline silicon. Referring to FIG. 3E, the result of step 278 of flowchart 200 is illustrated by structure 378.

Figure 3F:
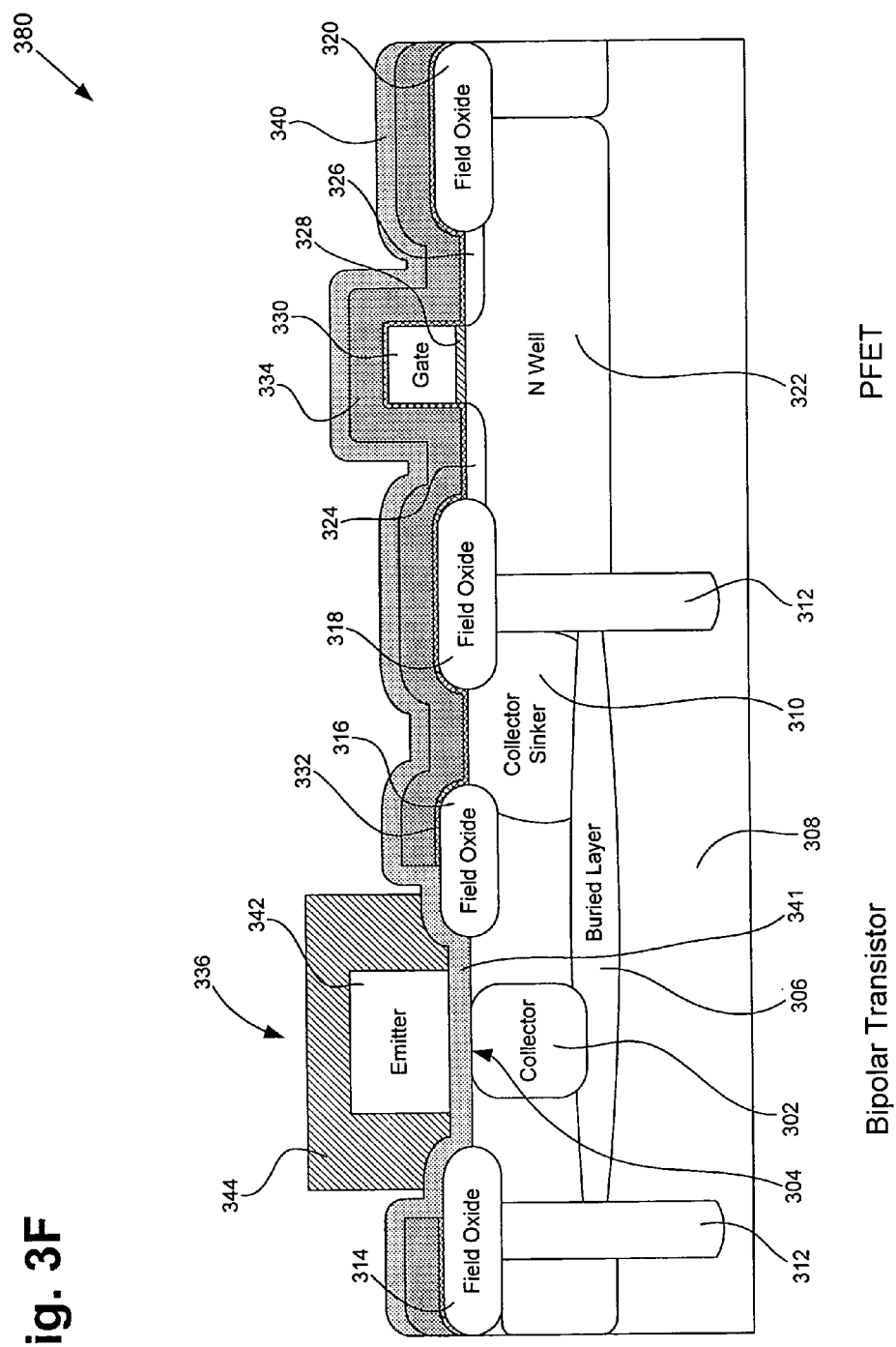
FIG. 3F illustrates cross-sectional views, which include portions of a wafer processed according to an embodiment of the invention, corresponding to certain steps of FIG. 2.

Continuing with step 280 in FIG. 2 and structure 380 in FIG. 3F, in step 280 of flowchart 200, mask 344 is formed to protect emitter 342 and a portion of base layer 340 in opening 336 prior to formation of handles to contact base 341. Mask 344 can comprise photoresist, which may be patterned in a manner known in the art. Mask 344 may also comprise other masking materials as known in the art. Referring to FIG. 3F, the result of step 280 of flowchart 200 is illustrated by structure 380.

Figure 3G:
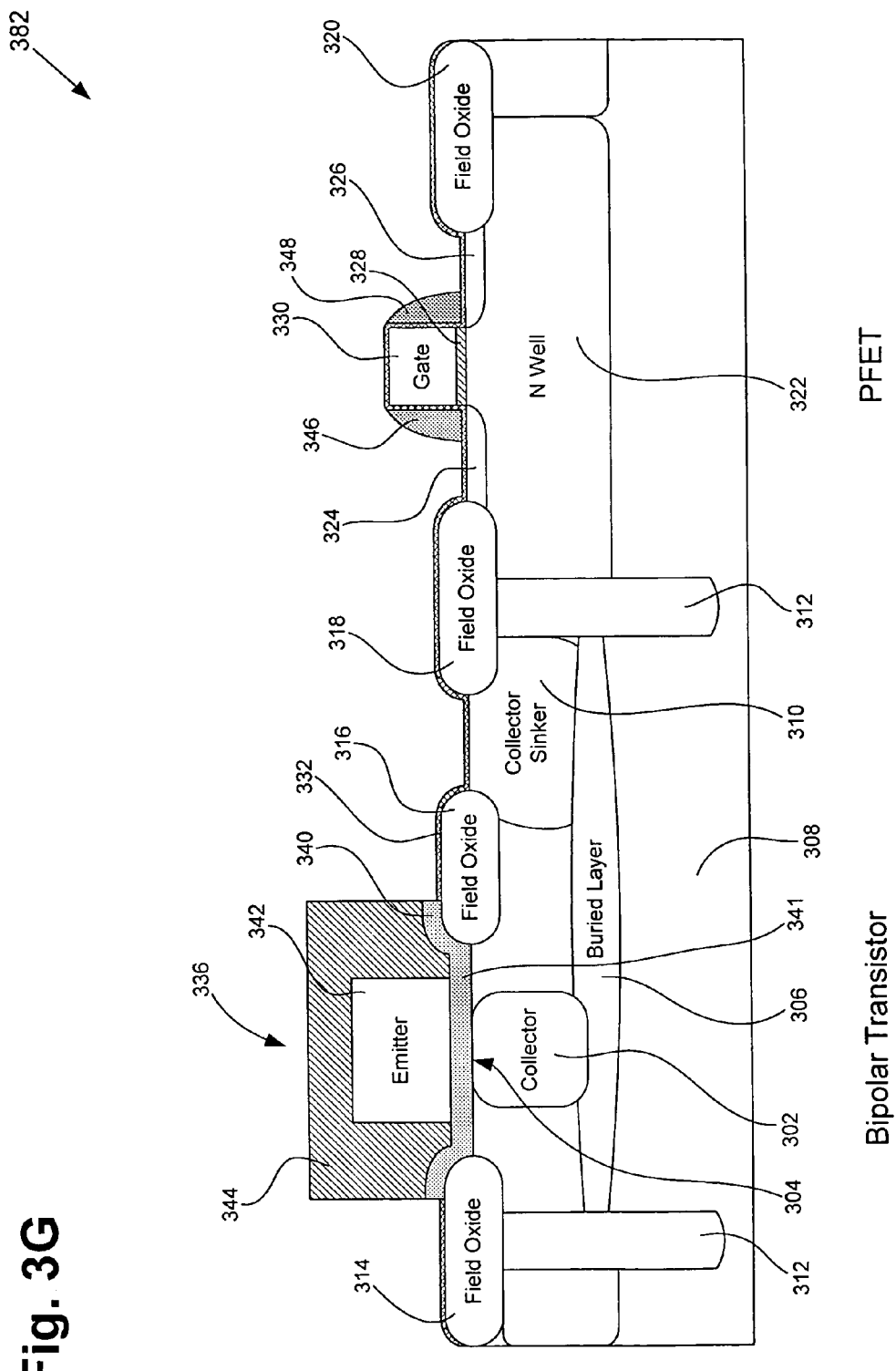
FIG. 3G illustrates cross-sectional views, which include portions of a wafer processed according to an embodiment of the invention, corresponding to certain steps of FIG. 2.

Continuing with step 282 in FIG. 2 and structure 382 in FIG. 3G, in step 282 of flowchart 200, portions of base layer 340 unprotected by mask 344 and conformal layer 334 are removed, and spacers 346 and 348 are formed adjacent to gate 330. In the present embodiment, portions of base layer 340 unprotected by mask 344, i.e. unwanted portions of base layer 340, can be removed by etching base layer 340 using an etchant comprising $Cl_2$/HBr/$HeO_2$. In the present invention, after base layer 340 has been etched, the etch chemistry is changed to a compatible enchant, such as an echant comprising a mixture of $CF_4$/$Cl_2$/HBr/$HeO_2$. The $CF_4$/$Cl_2$/HBr/$HeO_2$ mixture is utilized as an anisotropic etchant to etch back conformal layer 334 to form spacers 346 and 348. The $CF_4$/$Cl_2$/HBr/$HeO_2$ etchant will anisotropically etch back conformal layer 334 without undercutting portions of base layer 340 that are exposed on sides of mask 344 after previous removal of unwanted portions of base layer 340 via the $Cl_2$/HBr/$HeO_2$ etchant. In another embodiment, a pair of compatible enchants other than $Cl_2$/HBr/$HeO_2$ and $CF_4$/$Cl_2$/HBr/$HeO_2$, may be used to etch base layer 340 and anisotropically etch back conformal layer 334 without undercutting portions of base layer 340 that are exposed on sides of mask 344.

In contrast, in an approach that utilizes a SF6/HBr etchant to remove a conformal layer comprising silicon nitride, the SF6/HBr etchant causes undesirable lateral etching of exposed portions of base layer 340 discussed above. Thus, the present invention utilizes a etchant comprising a mixture of $CF_4/Cl_2/HBr/HeO_2$ to advantageously prevent lateral etching of portions of base layer 340 which are exposed after removal of unwanted portions of base layer 340. Referring to FIG. 3G, the result of step 382 of flowchart 200 is illustrated by structure 382.

In the present invention, conformal layer 334 is utilized to protect the CMOS areas of the substrate, e.g. the areas of the substrate where a PFET or an NFET is fabricated in the present embodiment, during fabrication of the bipolar transistor, and conformal layer 334 is also utilized to form spacers for the gates of CMOS transistors, e.g. the gate of a PFET or an NFET as described above. Thus, by utilizing conformal layer 334 for a dual purpose, i.e. to protect the CMOS areas and to form spacers for the CMOS gates, the present invention advantageously eliminates the need for a separate layer of material to protect the CMOS area during formation of the bipolar transistor. By eliminating the need for a separate protective layer of material, the present invention also eliminates the process steps required to deposit and remove the separate protective layer of material. Thus, by advantageously reducing process steps, the present invention reduces manufacturing cost.

Furthermore, by etching base layer 340 and etching back conformal layer 334 to form spacers 346 and 348 in the same process step, the present invention advantageously reduces process steps and simplifies process flow. Additionally, by utilizing a conformal layer of silicon nitride, i.e. conformal layer 334, to form spacers 346 and 348, the present invention advantageously provides nitride spacers adjacent to the gates of CMOS transistors, which results in increased performance of the CMOS transistors.

It is appreciated by the above detailed description that the invention provides method for forming spacers for gates of CMOS transistors on a substrate that also includes a bipolar transistor, resulting in a significantly simplified process flow and a concomitant reduction in manufacturing cost.

Although the invention is described as applied to the fabrication of a SiGe HBT and a PFET, the present invention also applies to other bipolar transistors, such as NPN or PNP HBTs comprising silicon, gallium-arsenide, or other materials. Furthermore, the present invention also applies to other MOS transistors, such as an NFET. From the description of the above invention it is evident that various techniques can be used for implementing the concepts of the present invention without departing from its scope and spirit. Moreover, while the invention has been described with specific reference to certain embodiments, a person of ordinary skills in the art would recognize that changes made in form and detail without departing from the spirit and scope of the invention.

The described embodiments are to be considered in all respects as illustrative and not restrictive. For example, although in the specific embodiment of the invention described above, emitter 342 was described as a polycrystalline emitter, it is possible to use an amorphous silicon emitter which is re-crystallized to form a polycrystalline silicon emitter, or to even use a single crystal silicon emitter fabricated by, for example, an "MBE" ("Molecular Beam Epitaxy") or an "MOCVD" ("Metal Organic Chemical Vapor Deposition) technique. Therefore, it should be understood that the invention is not limited to the particular embodiments described herein, but is capable of many rearrangements, modifications, and substitutions without departing from the scope of the invention.

Thus, method for forming CMOS transistor spacers in a BiCMOS process and related structure have been described.

What is claimed is:

1. A structure comprising:
   a transistor gate situated on a substrate;
   a conformal layer situated on said substrate, said conformal layer covering said transistor gate and said conformal layer having an opening;
   a base layer situated directly on said conformal layer and in said opening, wherein said base layer is situated over said transistor gate and on a top surface of a collector situated in said substrate;
   wherein said conformal layer is utilized to form spacers adjacent to said transistor gate, and wherein said base layer is utilized to form a transistor base on said collector.

2. The structure of claim 1 further comprising an etch stop layer situated between said substrate and said conformal layer.

3. The structure of claim 2 wherein said etch stop layer comprises TEOS silicon dioxide.

4. The structure of claim 1 wherein said conformal layer comprises silicon nitride.

5. The structure of claim 1 wherein said base layer comprises silicon-germanium.

6. The structure of claim 1 wherein said transistor gate is a PFET gate.

7. A structure comprising:
   a transistor gate situated on a substrate;
   an etch stop layer situated on said substrate, said etch stop layer being in direct contract with said transistor gate;
   a conformal layer situated in direct contact with said etch stop layer;
   a base layer situated on said conformal layer and in an opening in said conformal layer and said etch stop layer;
   wherein said conformal layer is utilized to form spacers adjacent to said transistor gate.

8. The structure of claim 7 further comprising an emitter situated on said base layer in said opening.

9. The structure of claim 7 wherein said etch stop layer comprises TEOS silicon dioxide.

10. The structure of claim 7 wherein said conformal layer comprises silicon nitride.

11. The structure of claim 7 wherein said base layer comprises silicon-germanium.

12. The structure of claim 7 wherein said transistor gate is a PFET gate.

* * * * *